United States Patent
Emma

(10) Patent No.: US 9,911,726 B2
(45) Date of Patent: *Mar. 6, 2018

(54) METHOD AND APPARATUS TO FACILITATE DIRECT SURFACE COOLING OF A CHIP WITHIN A 3D STACK OF CHIPS USING OPTICAL INTERCONNECT

(71) Applicant: International Business Machines Corporation, Armonk, NY (US)

(72) Inventor: Philip G. Emma, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/625,324

(22) Filed: Jun. 16, 2017

(65) Prior Publication Data

US 2018/0006007 A1 Jan. 4, 2018

Related U.S. Application Data

(63) Continuation of application No. 15/434,289, filed on Feb. 16, 2017, now Pat. No. 9,748,218, which is a
(Continued)

(51) Int. Cl.
| | |
|---|---|
| *H01L 23/473* | (2006.01) |
| *H01L 25/00* | (2006.01) |
| *H01L 33/64* | (2010.01) |
| *H01L 23/44* | (2006.01) |
| *H01L 23/42* | (2006.01) |

(Continued)

(52) U.S. Cl.
CPC .............. *H01L 25/50* (2013.01); *H01L 21/52* (2013.01); *H01L 23/02* (2013.01); *H01L 23/34* (2013.01); *H01L 23/42* (2013.01); *H01L 23/44* (2013.01); *H01L 23/46* (2013.01); *H01L 23/467* (2013.01); *H01L 23/473* (2013.01); *H01L 25/0756* (2013.01); *H01L 31/12* (2013.01); *H01L 33/641* (2013.01); *H01L 33/642* (2013.01); *H01L 33/648* (2013.01); *H01L 2933/0033* (2013.01);
(Continued)

(58) Field of Classification Search
CPC ......... H01L 23/34; H01L 23/42; H01L 23/46; H01L 23/467; H01L 23/473
See application file for complete search history.

(56) References Cited

U.S. PATENT DOCUMENTS 5,200,631 A * 4/1993 Austin ..................... G02B 6/43
257/433
5,834,841 A * 11/1998 Suzuki ................. G02B 6/4201
257/433

(Continued)

*Primary Examiner* — Eduardo A Rodela

(57) ABSTRACT

In one embodiment, the disclosure relates to a system of stacked and connected layers of circuits that includes at least one pair of adjacent layers having very few physical (electrical) connections. The system includes multiple logical connections. The logical interconnections may be made with light transmission. A majority of physical connections may provide power. The physical interconnections may be sparse, periodic and regular. The exemplary system may include physical space (or gap) between the a pair of adjacent layers having few physical connections. The space may be generally set by the sizes of the connections. A constant flow of coolant (gaseous or liquid) may be maintained between the adjacent pair of layers in the space.

1 Claim, 4 Drawing Sheets

Related U.S. Application Data continuation of application No. 15/196,672, filed on Jun. 29, 2016, now Pat. No. 9,646,916.

(51) Int. Cl.
| | |
|---|---|
| *H01L 31/12* | (2006.01) |
| *H01L 25/075* | (2006.01) |
| *H01L 23/02* | (2006.01) |
| *H01L 23/46* | (2006.01) |
| *H01L 21/52* | (2006.01) |
| *H01L 23/34* | (2006.01) |
| *H01L 23/467* | (2006.01) |

(52) U.S. Cl.
CPC ............. *H01L 2933/0066* (2013.01); *H01L 2933/0075* (2013.01)

(56) References Cited

U.S. PATENT DOCUMENTS

| | | |
|---|---|---|
| 8,546,930 B2 | 10/2013 | Bakir et al. |
| 8,989,532 B2 | 3/2015 | Barowski et al. |
| 9,178,618 B2 | 11/2015 | DeCusatis et al. |

\* cited by examiner

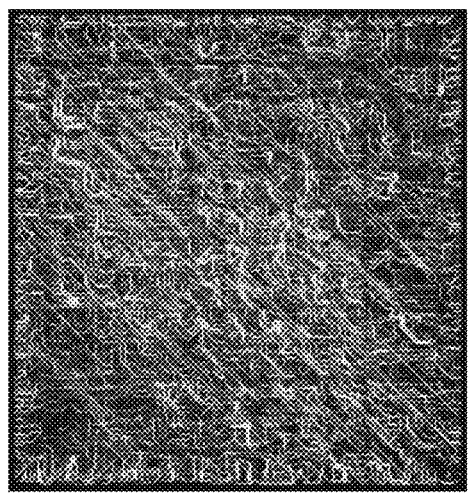
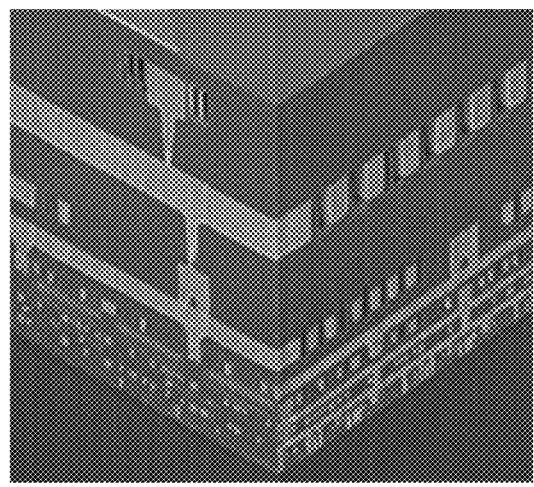
Fig. 2A                    Fig. 2B

METHOD AND APPARATUS TO FACILITATE DIRECT SURFACE COOLING OF A CHIP WITHIN A 3D STACK OF CHIPS USING OPTICAL INTERCONNECT

The instant application is a continuation of application Ser. No. 15/434,289 ("the '289 application"), filed Feb. 16, 2017, the '289 application is a continuation of application Ser. No. 15/196,672 ("the '672 application") filed Jun. 29, 2016. The instant application claims priority to both the '289 application and the '672 application, the disclosures of which are incorporate herein in entirety.

BACKGROUND

Field

The disclosure relates to a method, apparatus and system to facilitate surface cooling of a microchip (interchangeably, chip) within a three-dimensional (3D) stack of microchips using optical interconnect. Specifically, the disclosure relates to method, system and apparatus to provide optical interconnect for a microchip within a 3D stack so as to enable inter-layer cooking of the microchip stack.

Description of Related Art

In conventional semiconductor fabrication processes, semiconductor microchips are frequently attached to other chips or other electronic structures. The attachment of a semiconductor chip is frequently accomplished by one of two techniques. The first technique is a wire bonding process in which each of a series of I/O bump terminals on a chip built on an aluminum bonding pad is sequentially bonded to the connecting pads on a substrate. The second technique is a flip chip attachment method in which all the I/O bumps on a semiconductor chip are first terminated with a solder material. A frequently used solder material is a lead/tin composition with high melting temperature alloy. The semiconductor chip is then flipped over and the solder bumps are aligned and reflowed in a reflow furnace to effect all the I/O connections with the bonding pads on the substrate. One advantage achieved by the flip chip process is its applicability to very high density CMOS circuits and its high reliability in the interconnects formed when compared to the wire bonding process.

Within a stack of tightly connected chips, there is no direct physical access to planar layers. Thus, cooling is primarily done by removing heat from the edges of the chip stack. Additional means for removing heat includes adding heat sinks to one or more sides of the chips. However, heat sinks also contact only one side of the chip. Heatsinks, even when coupled with heat removing fins, fail to rapidly remove heat from the center of the chip stack. Moreover, heat sinks adversely increase spatial requirement of the chip stack. There is a need for a method and apparatus to provide rapid cooling to a chip stack that overcomes these and other deficiencies of the art.

SUMMARY OF THE INVENTION

In one embodiment, the disclosure relates to a chip stack, comprising: a first microchip having a first plurality of light emitting diodes formed at a surface thereof; a second microchip having a second plurality of light emitting diodes formed at a surface thereof, the second microchip arranged substantially aligned with the first microchip to form an aperture therebetween; a plurality of optical paths connecting the first plurality of light emitting diodes to a second plurality of light emitting diodes through the aperture to thereby provide surface-to-surface optical data communication between the first microchip and the second microchip, each of the plurality of optical paths defined by an alignment between one of the first plurality of light emitting diodes and a corresponding one of the second plurality of light emitting diodes; a plurality of metal interconnects connecting the first microchip to the second microchip, the plurality of metal interconnects exclusively communicating power or ground between the first microchip and the second microchip; and a coolant disposed in the aperture, the aperture configured to receive incoming coolant at an aperture inlet and to exit coolant at an aperture outlet; wherein the all data communications between the first microchip and the second microchip is exclusively through surface-to-surface optical communication, and wherein the pitch distance between adjacent metal interconnects is about 400-500µ.

BRIEF DESCRIPTION OF THE DRAWINGS

These and other embodiments of the disclosure will be discussed with reference to the following exemplary and non-limiting illustrations, in which like elements are numbered similarly, and where:

FIG. 2A illustrates the top view of a conventional microchip stack;

FIG. 2B illustrates the side view of a conventional microchip stack;

DETAILED DESCRIPTION

The conventional method for cooling a chip is to couple a heat sink to the chip's back side. In some implementations, the heat sink is cooled with flow of liquid coolant or air. Thermally coupling the back of the chip to the heat sink is typically accomplished with thermal grease. This is due to the fact the back of the chip and the heat sink may not touch perfectly. Thermal grease generally has poor thermal conductivity.

In other chip cooling methods, the air is flown directly over the chip (e.g., by a running a fan and motor). The fanning may be done on either the active side or the flip side of the chip. The decision to fan the active or the flip side of the chip may be made by considering how severely the oxides act as insulators. However, with relatively simple single-chip packages, this has not been needed for two reasons. First, there may be not be a need to push thermal density to the point where this approach is necessary. Second, where the chip connects to a package, there may be too many interconnections. That is, the dense interconnection may facilitate a heavy and regular lateral flow of coolant between the surfaces.

In 3D systems there may be severe power-density causing large thermal dissipation. Therefore, it may not be sufficient to merely cool the top layer of the 3D stack. A cooling infrastructure is required within the stack for intermediate layers. According to certain embodiments, a method and system is provided to cool the chip stack through the intermediate layers.

The 3D chip stacks are used more frequently. The intermediate chip surfaces are not open to coolant flow and tend to heat rapidly with little or no thermal outlet. Conventional methods cool the edges of the 3D chip stack. The chip internals must couple to external cooling by thermal flow through the other chips in the stack. Thermal flow between layers is very poor and inefficient. If the adjacent layers generate substantial heat it may be difficult, if not impossible, to effectively cool the chip interlayers.

Figure 1A:
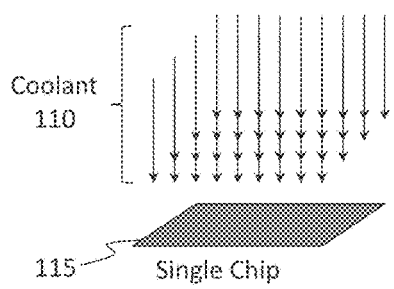
FIG. 1A schematically shows a conventional cooling system for a single microchip.

FIG. 1A schematically shows a conventional cooling system for a single microchip. Specifically, FIG. 1A schematically shows single chip 115 having an upper and lower surfaces. The upper surface of chip 115 is exposed to coolant 110. Coolant 110 may be, for example, air movement caused by an external fan (not shown). Thus, chip 115 is cooled from one side only.

Figure 1B:
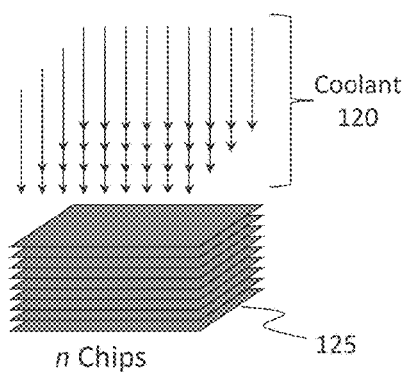
FIG. 1B shows a conventional microchip stack and cooling system.

FIG. 1B shows a conventional microchip stack. In FIG. 1B chips 125 are stacked to form a complex 3D chip stack. Coolant 110 is flown over the top surface of chip stack 125. Within the stack of tightly connected chips, there may be no direct physical access to planar layers. Thus, cooling is primarily done by extracting heat from the edges. Given that n chips are assembled to form chip stack 125, heat generated from chip stack 125 is significantly higher than heat generated from single chip 115. Even if significantly higher volume of coolant (e.g., air) 120 was moved over chip stack 125, it may still be deficient to adequately cool chip stack 125. Heat buildup in chip stack 125 may lead to failure and bad user experience.

FIG. 2A illustrates the top view of a conventional microchip stack. Specifically, the top view shows wiring between layers. As evident from FIG. 2A, a large number of connection wires cover the layer surface of the microchip. These wires require physical and electrical insulations. FIG. 2B illustrates the side view of a conventional microchip stack. FIG. 2B also shows wiring layers and oxide layers interposed between different microchip layers. Oxides are very poor thermal conductors and also need insulation.

In one embodiment of the disclosure, chip internals are coupled to external cooling source and the chip is cooled by thermal flow of coolant through one or more chip layers in the stack. In certain embodiments, the disclosure provides how to run active cooling (fluid or air) directly over chip surfaces when those surfaces are within a 3D stack. A challenge in cooling multi-chip stack is that the substantial number of interconnections between the surfaces inhibit coolant flow. The conventional microchip stack has dense and irregular interconnections (see, for example, FIGS. 2A and 2B).

To overcome the electrical interconnection, in one embodiment of the disclosure, most of the wire connections are replaced with optical connections. Metal connections are maintained for power delivery (i.e., power and ground) to the microchip stacks. The optical power connections may be sparse and may be regularly placed to facilitate a regular and ample flow of liquids or air to cool between the layers.

Figure 3:
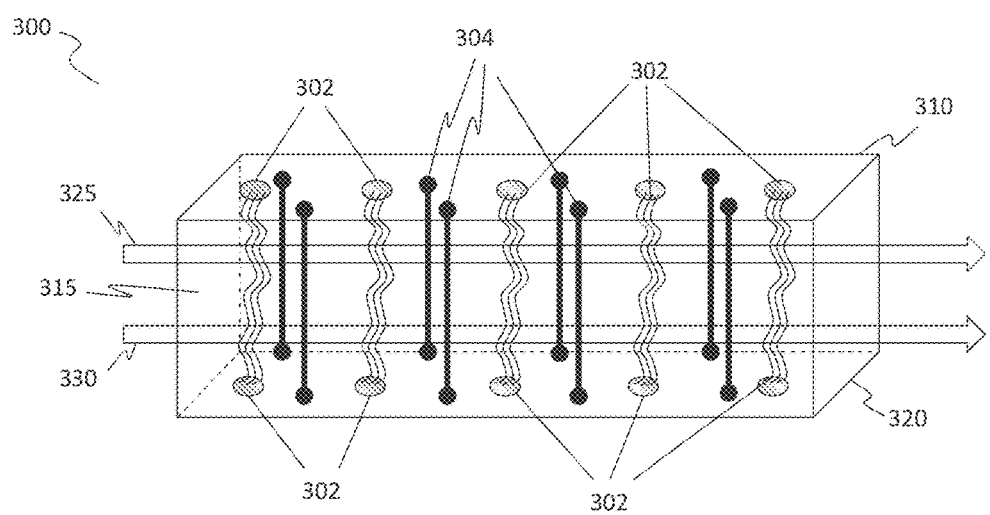
FIG. 3 shows an exemplary inter-chip cooling system according to one embodiment of the disclosure.

FIG. 3 shows an exemplary inter-chip cooling system according to one embodiment of the disclosure. In FIG. 3, microchip stack 300 includes interlayer 315 formed between microchip layers 310 and 320. Interlayer 315 may define a gap between the two microchip surfaces. Metal bars 304 provide power and ground connection between microchips 310 and 320. Metal bars 304 are sparsely located throughout the gap and take physical space. In one embodiment of the disclosure, the pitch distance between adjacent the metal connections is about 400-500 microns.

Optical connection points 302 are formed in each of microchips 310 and 320 to provide optical interconnection between the microchips. Thus, most interconnections (e.g., busses, etc.) are carried out optically. Each of connection points 302 may defines LEDs, VCSELs and photodiodes. In one embodiment of the disclosure, the optical wiring pitch is about 1-2 microns. In another embodiment, the transmission distance (i.e., the distance between adjacent microchips 310 and 320) is about 20-50 microns. The power requirement for powering the VCSELs and photodiodes is very low. Locations for top optical connections may be configured in microchips 310 and 320 to be substantially aligned so as to provide a direct optical path 311 as schematically depicted in FIG. 3. Optical interconnections also provide ample redundancy and tens of thousands or millions of signals may be communicated optically. Optical interconnections do not interfere with coolant flow in gap 315. In FIG. 3, coolant flow is shown by arrows 325 and 330.

As stated, only a small number of signal connections may be in metallic form 304. For example, power, ground, test infrastructure, clock signals and certain control signals may be conveyed with metal interconnections.

An exemplary implementation of the disclosed embodiments may be at processor-to-memory interface. At these interfaces, the signals comprise large busses of latched data and relatively few control signals. Optical interconnection may be used to convey connections that were traditionally done by large busses.

While particles or bubbles may interfere with some of the surface-to-surface optical signals, induced errors may be unidirectional and may be easily detected using Berger codes. Further, in cases where the error may pose a serious problem, the bits of codeword (data and its error-correcting code) may be physically dispersed across enough area so as to make the likelihood of a single bubble disrupting more than a single bit within the codeword minuscule.

Figure 4:
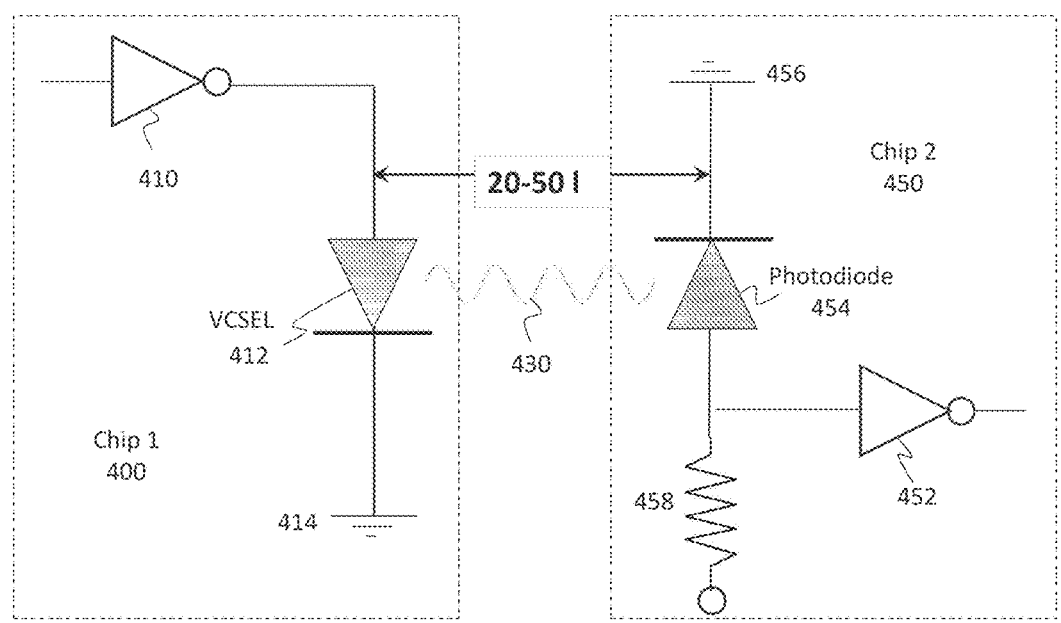
FIG. 4 shows an exemplary interconnected microchip stack according to one embodiment of the disclosure.

FIG. 4 shows an exemplary interconnected microchip stack according to one embodiment of the disclosure. In FIG. 4, two microchips 400 and 450 are shown side by side with a gap therebetween. However, the microchips may be part of a multi-chip stack and positioned vertically with respect to each other. Microchip 400 includes logic gate 410 and VCSEL 412 which may communicate (send and receive) optical signal 430 to photodiode 454 of microchip 450. As shown in FIG. 4, VCSEL 412 may be grounded 414. Ground connection 414 may be done through metal wiring as discussed in relation to FIG. 3.

Microchip 450 includes photodiode 454 connected to logic 452 and resistor circuit 458. Photodiode 454 may optically communicate 430 with VCSEL 412. Photodiode 454 may include one or a plurality of photodiodes (not shown). Moreover, the circuit diagram of FIG. 4 is limited to two contact points. It is understood by one of ordinary skill in the art that each of microchips 400 and 452 may have multiple optical circuits concurrently communicating with a respective communication point of the other microchip.

In one embodiment, the disclosure relates to a system of stacked and connected layers of circuits that includes at least one pair of adjacent layers having very few physical (electrical) connections. The system includes multiple logical connections. The logical interconnections may be made with light transmission. A majority of physical connections may provide power. The physical interconnections may be sparse, periodic and regular. The exemplary system may include physical space (or gap) between the a pair of adjacent layers having few physical connections. The space may be generally set by the sizes of the connections. A constant flow of coolant (gaseous or liquid) may be maintained between the adjacent pair of layers in the space.

While the principles of the disclosure have been illustrated in relation to the exemplary embodiments shown herein, the principles of the disclosure are not limited thereto and include any modification, variation or permutation thereof.

What is claimed is:

1. A chip stack, comprising:
   a first microchip having a first plurality of light emitting diodes formed at a surface thereof;
   a second microchip having a second plurality of light emitting diodes formed at a surface thereof, the second microchip arranged substantially aligned with the first microchip to form an aperture therebetween;
   a plurality of optical paths connecting the first plurality of light emitting diodes to a second plurality of light emitting diodes through the aperture to thereby provide surface-to-surface optical data communication between the first microchip and the second microchip, each of the plurality of optical paths defined by an alignment between one of the first plurality of light emitting diodes and a corresponding one of the second plurality of light emitting diodes;
   at least one metal interconnect connecting the first microchip to the second microchip, the at least one metal interconnects communicating power or ground between the first microchip and the second microchip; and
   wherein the aperture, the aperture is configured to receive incoming coolant at an aperture inlet and to exit coolant at an aperture outlet;
   wherein the all data communications between the first microchip and the second microchip is exclusively through surface-to-surface optical communication, and
   wherein the pitch distance between adjacent metal interconnects is about 400-500 µ.

* * * * *